United States Patent [19]

Dumoulin et al.

[11] Patent Number: 5,447,156
[45] Date of Patent: Sep. 5, 1995

[54] MAGNETIC RESONANCE (MR) ACTIVE INVASIVE DEVICES FOR THE GENERATION OF SELECTIVE MR ANGIOGRAMS

[75] Inventors: Charles L. Dumoulin, Ballston Lake; Paul A. Bottomley, Clifton Park, both of N.Y.; Steven P. Souza, Williamstown, Mass.

[73] Assignee: General Electric Company, Schenectady, N.Y.

[21] Appl. No.: 222,053

[22] Filed: Apr. 4, 1994

[51] Int. Cl.$^6$ ............................................. A61B 5/055
[52] U.S. Cl. ............................. 128/653.2; 128/653.3; 128/653.5; 128/899
[58] Field of Search ............... 128/653.2, 653.3, 653.5, 128/899

[56] References Cited

U.S. PATENT DOCUMENTS

| | | | |
|---|---|---|---|
| 4,932,411 | 6/1990 | Fritschy et al. | 128/653.5 |
| 5,050,607 | 9/1991 | Bradley et al. | 128/653.2 |
| 5,170,789 | 12/1992 | Narayan et al. | 128/653.5 |
| 5,211,166 | 5/1993 | Sepponen | 128/653.5 |
| 5,271,400 | 12/1993 | Dumoulin et al. | 128/653.2 |
| 5,303,707 | 4/1994 | Young | 128/653.2 |
| 5,307,808 | 5/1994 | Dumoulin et al. | 128/653.2 |
| 5,307,814 | 5/1994 | Kressel et al. | 128/653.5 |
| 5,318,025 | 6/1994 | Dumoulin et al. | 128/653.2 |

FOREIGN PATENT DOCUMENTS 0385367  9/1990  European Pat. Off. ......... 128/653.5

*Primary Examiner*—Krista M. Pfaffle
*Attorney, Agent, or Firm*—Lawrence P. Zale; Marvin Snyder

[57] ABSTRACT

A magnetic resonance (MR) active invasive device system employs a radio-frequency (RF) coil embedded in an invasive device for the purpose of generating MR angiograms of a selected blood vessels. A subject is first placed in a polarizing magnetic field. The invasive device is then placed into a selected blood vessel of the subject such that the RF coil of the invasive device is located at or near the root of a vessel tree desired to be imaged. The RF coil is then used to alter the nuclear spin magnetization of blood flowing within the vessel. This is done by employing an RF excitation signal to the coil at the Larmor frequency of the blood. The nutation of spin magnetization can change the amount of longitudinal spin magnetization or the Amount of magnetization in the transverse plane. Because the size of the radio-frequency coil in the invasive device is small, the change in spin magnetization is limited to blood flowing by the invasive device. An MR imaging pulse sequence is then applied to the subject to obtain image information from the region containing the desired vessel tree. The MR imaging pulse sequence is designed to selectively detect the blood whose spin magnetization has been changed by the MR-active invasive device. Since only blood which the magnetization has modified is detected with the imaging sequence, the vessel tree is imaged.

4 Claims, 6 Drawing Sheets

MAGNETIC RESONANCE (MR) ACTIVE INVASIVE DEVICES FOR THE GENERATION OF SELECTIVE MR ANGIOGRAMS

CROSS REFERENCES TO RELATED APPLICATIONS

This application is related to U.S. patent applications "TRACKING SYSTEM AND PULSE SEQUENCES TO MONITOR THE POSITION AND ORIENTATION OF A DEVICE USING MAGNETIC RESONANCE" Ser. No. 07/861,718, now Pat. No. 5,307,808; "TRACKING SYSTEM TO MONITOR THE POSITION AND ORIENTATION OF A DEVICE USING MAGNETIC RESONANCE DETECTION OF A SAMPLE CONTAINED WITHIN THE DEVICE" Ser. No. 07/861,662now Pat. No. 5,271,400; and "TRACKING SYSTEM TO MONITOR THE POSITION AND ORIENTATION OF A DEVICE USING MULTIPLEXED MAGNETIC RESONANCE DETECTION" Ser. No. 07/861,690, now Pat. No. 5,318,025 all by Dr. Charles L. Dumoulin, Dr. Steven P. Souza and Robert D. Darrow, all filed on Apr. 1, 1992, all assigned to the present assignee, and all incorporated by reference.

BACKGROUND OF THE INVENTION

1. Field of the Invention

The present invention relates to medical imaging of blood vessels, and more particularly concerns the use of magnetic resonance to obtain such imaging.

2. Description of Related Art

Angiography, or the imaging of vascular structures, is very useful in diagnostic and therapeutic medical procedures. In X-ray angiography, a bolus of x-ray opaque liquid is placed into the vessel of interest through an invasive device placed into the vessel. While the bolus is within the vessel, a series of X-ray images is obtained which highlight the X-ray absorbing liquid.

X-ray angiography carries several significant risks to the patient. For example, the x-ray opaque liquid can cause discomfort and adverse reactions within the patient. While conventional X-ray fluoroscopes are designed to minimize X-ray dosage, some procedures can be very long and the accumulated X-ray dose to the subject can become significant. The long term exposure of the attending medical staff is of even greater concern since they participate in these procedures regularly. Consequently, it is desirable to reduce or eliminate the X-ray dose during these procedures.

X-ray angiography, typically produces a single two-dimensional image. Information concerning the depth of an object within the field-of-view is not available to the operator. It is often desirable to obtain this information during diagnostic and therapeutic procedures.

Magnetic resonance (MR) imaging procedures for the imaging of vascular structures have recently become available. MR angiography is performed with a variety of methods, all of which rely on one of two basic phenomena. The first phenomena arises from changes in longitudinal spin magnetization as blood moves from one region of the patient to another. Methods that make use of this phenomenon have become known as "in-flow" or "time-of-flight" methods. A commonly used time-of-flight method is three-dimensional time-of-flight angiography. With this method, a region of interest is imaged with a relatively short repetition time, TR, and a relatively strong excitation radio-frequency (RF) pulse. This causes the MR spins within the field-of-view to become saturated and give weak MR response signals. Blood flowing into the field-of-view, however, enters in a fully relaxed state. Consequently, this blood gives a relatively strong MR response signal, until it too becomes saturated. Because of the nature of blood vessel detection with time-of-flight methods, the stationary tissue surrounding the vessel cannot be completely suppressed. In addition, slowly moving blood, and blood that has been in the imaged volume for too long, becomes saturated and is poorly imaged.

A second type of MR angiography is based on the induction of phase shifts in transverse spin magnetization. These phase shifts are directly proportional to velocity and are induced by flow-encoding magnetic field gradient pulses. Phase-sensitive MR angiography methods exploit these phase shifts to create images in which the pixel intensity is a function of blood velocity. While phase-sensitive MR angiography can easily detect slow flow in complicated vessel geometries, it will also detect any moving tissue within the field-of-view. Consequently, phase-sensitive MR angiograms of the heart have artifacts arising from the moving heart muscle and from the moving pools of blood in the heart chambers.

Several methods for the tracking of an interventional device using MR have also been disclosed. These have been described in the U.S. Patent applications previously mentioned in 'CROSS REFERENCES TO RELATED APPLICATIONS'. Following an invasive device within a patient using these MR techniques has the advantage that the invasive device location is determined using the same physical relationships used to make the MR image. Consequently, the registration of invasive device position with respect to the image is excellent. These, however, do not specifically image blood vessels, but provide MR images with a superimposed symbol representing the position of an invasive device.

Currently, there is a need for a simple method of obtaining high quality angiograms of a selected vessel without the risks of exposure to ionizing radiation and X-ray opaque contrast injections.

SUMMARY OF THE INVENTION

A magnetic resonance (MR) vascular imaging system performs imaging of selected vascular structures within a body by employing a magnet, pulsed magnetic field gradient system, a radio-frequency (RF) transmitter, a RF receiver and a controller. The MR vascular imaging system employs an MR-active invasive device containing at least one small RF coil. A subject is placed in the magnet causing nuclear spins of the subject to become polarized. The MR-active invasive device is then inserted into a blood vessel of the subject such that the RF coil is located at or near a root of a vessel tree desired to be imaged. An RF signal is then applied to the RF coil in the MR-active invasive device to alter the nuclear spin magnetization of blood flowing within the vessel. The RF signal is at the Larmor frequency of the blood. The nutation of spin magnetization can alter the amount of longitudinal spin magnetization or it can alter the amount of magnetization in the transverse plane. Because the size of the RF coil in the invasive device is small, the change in spin magnetization is limited to blood flowing by the invasive device. An MR imaging sequence is then applied to the subject to obtain image information from the region containing the vessel tree of interest. The MR imaging sequence is designed to selectively detect blood whose spin magnetization has been changed by the MR-active invasive device. Since only blood which has been modified is detected with the imaging sequence, a vessel tree image is obtained.

OBJECTS OF THE INVENTION

It is an object of the present invention to provide a system for imaging selected blood vessels using magnetic resonance.

It is another object of the present invention to provide a method of MR angiography which employs an invasive device to modify the magnetic resonance state of blood within the detected vessel tree.

BRIEF DESCRIPTION OF THE DRAWINGS

The features of the invention believed to be novel are set forth with particularity in the appended claims. The invention itself, however, both as to organization and method of operation, together with further objects and advantages thereof, may be best understood by reference to the following description taken in conjunction with the accompanying drawing in which:

DETAILED DESCRIPTION OF THE INVENTION

Figure 1:
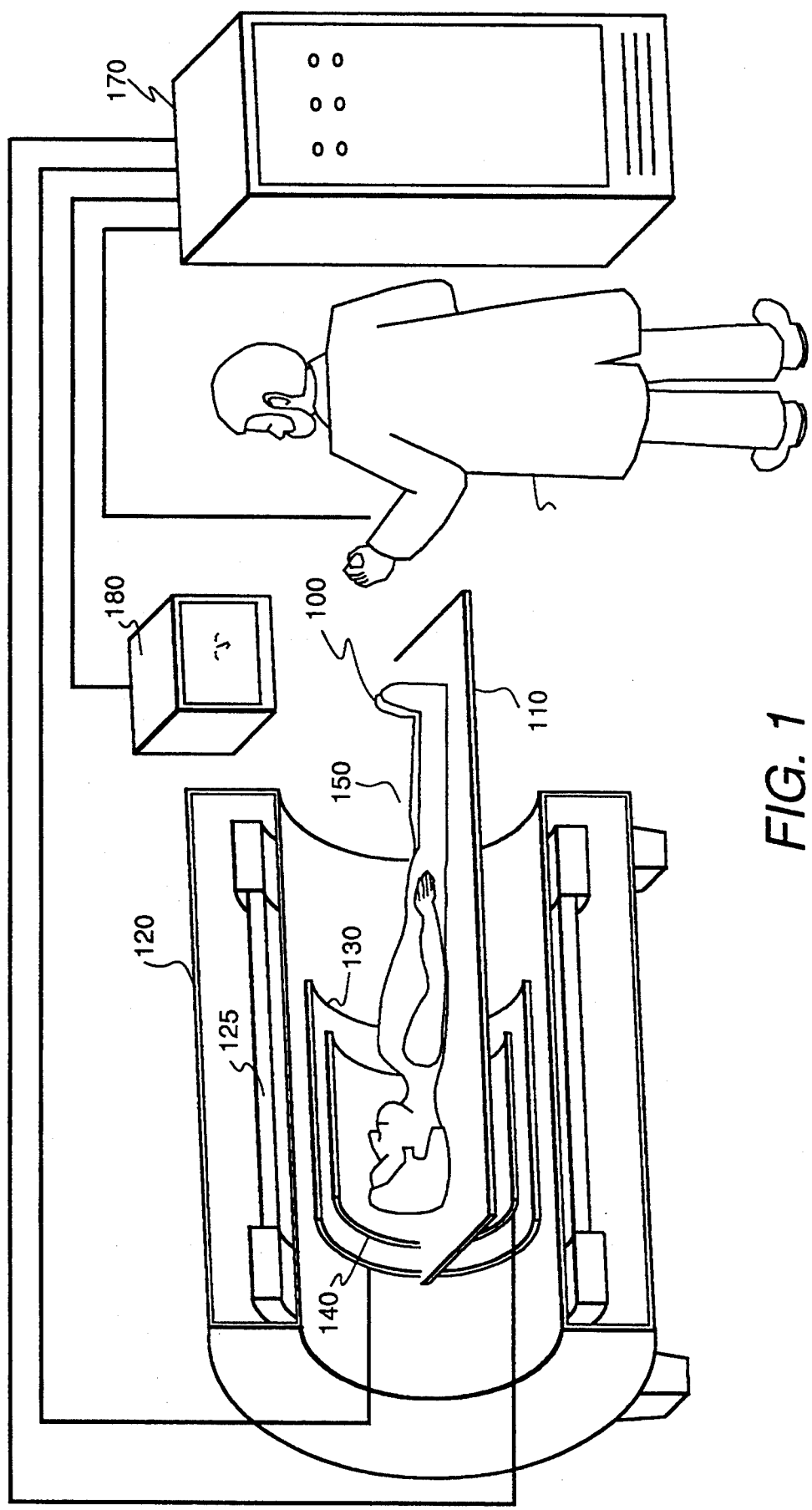
FIG. 1 is a perspective view of one embodiment of the present invention in operation in which a vessel selective angiogram is being obtained from a subject.

In FIG. 1, a subject 100 is placed on a support table 110 and positioned in a homogeneous magnetic field generated by a magnet 125 encased in a magnet housing 120. Magnet 125 and magnet housing 120 have cylindrical symmetry and are shown sectioned in half to reveal the position of subject 100. A region of interest of subject 100 is located in the approximate center of the bore of magnet 125. Subject 100 is surrounded by a set of cylindrical magnetic field gradient coils 130 which create magnetic field gradients of predetermined strength at predetermined times according to predetermined MR pulse sequences, described later. Gradient coils 130 generate magnetic field gradients in three mutually orthogonal directions. At least one external radio-frequency (RF) coil 140 (only one is shown in FIG. 1) also surrounds the region of interest of subject 100. In FIG. 1, RF coil 140 has a cylindrical shape with a diameter sufficient to encompass the entire subject. Other geometries, such as smaller cylinders specifically designed for imaging the head or an extremity, can be used in alternative embodiments. Non-cylindrical external radio-frequency coils, such as surface coils, may also be used. External RF coil 140 radiates radio-frequency energy into subject 100 at predetermined times and with sufficient power at a predetermined frequency so as to nutate a population of nuclear magnetic spins, hereinafter referred to as 'spins', of subject 100 in a fashion well known to those skilled in the art. External RF coil 140 can also act as a receiver, detecting the MR response signals which are stimulated by nutation, if desired.

The nutation of the spins causes them to resonate at the Larmor frequency. The Larmor frequency for each spin is directly proportional to the strength of the magnetic field experienced by the spin. This field strength is the sum of the static magnetic field generated by magnet 125 and the local field generated by magnetic field gradient coil 130.

An MR-active invasive device 150 is inserted into a region of interest of subject 100 by an operator 160. MR-active invasive device 150 may be a guide wire, a catheter, an endoscope, a laparoscope, a biopsy needle or similar device. MR-active invasive device 150 contains at least one RF coil which can be excited to cause nutation of nuclear spins in a fashion similar to external RF coil 140. Since the RF coil of MR-active invasive device 150 is small, the region of nutation is also small. Consequently, only those nuclear spins in the immediate vicinity of the coil are nutated.

The RF coil of MR-active invasive device 150 can also be used to detect MR response signals which are stimulated by excitation of external RF coil 140, or immediately after excitation by the RF coil of MR-active invasive device 150. These detected MR response signals can be sent to an imaging unit 170 where they are analyzed.

Figure 2B:
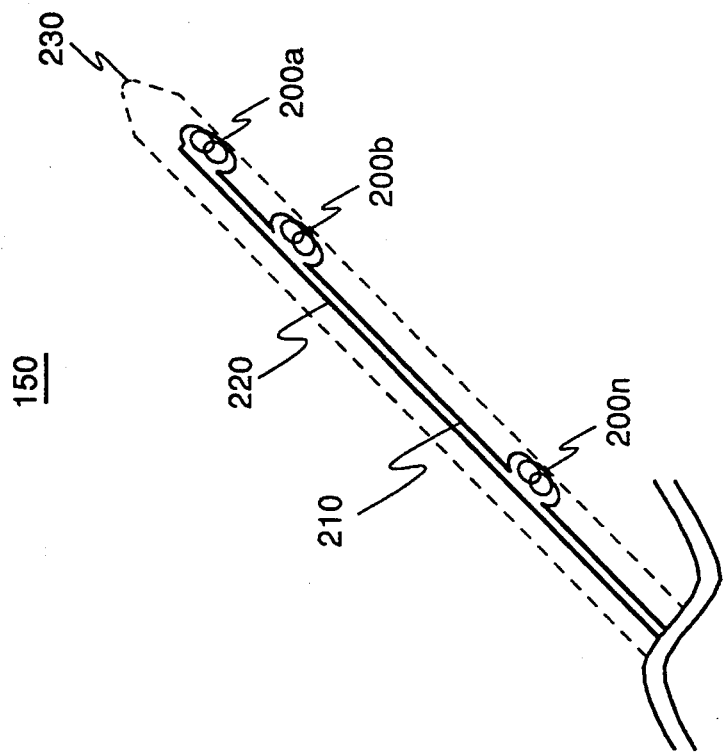
FIG. 2b is a schematic illustration of a second embodiment of multiple RF coils incorporated into an invasive device intended to be inserted into the body of a subject.
Figure 2A:
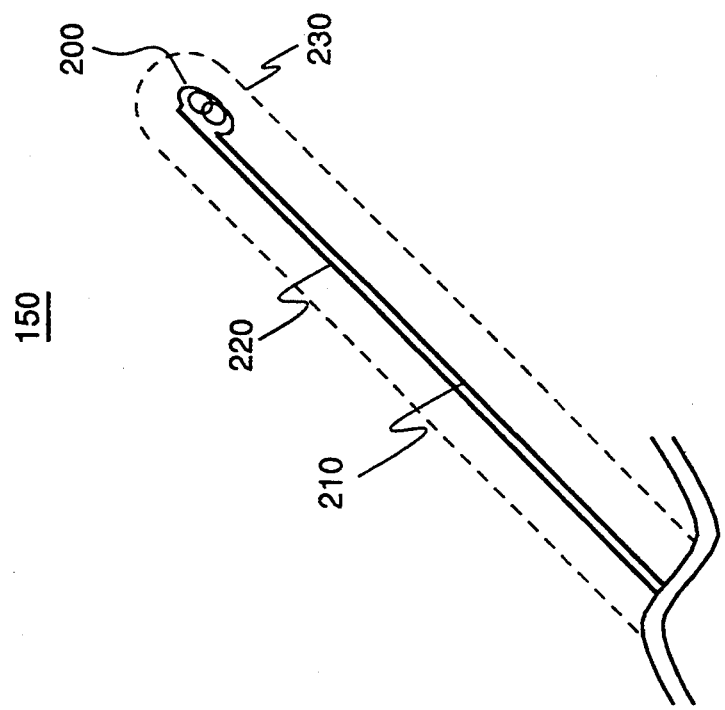
FIG. 2a is a schematic illustration of one embodiment of an RF coil incorporated into an invasive device intended to be inserted into the body of a subject.

Two embodiments of MR-active invasive device 150 are shown in greater detail in FIGS. 2a and 2b. In the embodiment of FIG. 2a, a single small RF coil 200 is electrically connected to the MR system via pairs of conductors 210 and 220. In the embodiment of FIG. 2b, several RF coils 200a, 200b . . . 200n are connected in series and are connected to the MR system via a single pair of conductors. In this embodiment, all RF coils 200a, 200b . . . 200n are excited simultaneously and each nutates nuclear spin magnetization in its immediate vicinity. An alternative geometry is to provide individual pairs of conductors for each RF coil. In all embodiments, conductors having a co-axial structure are preferred to minimize interaction with tissue outside the immediate vicinity of small RF coil 200. The RF coil and conductor pairs are encased in an outer shell 230 of MR-active invasive device 150.

Figure 3:
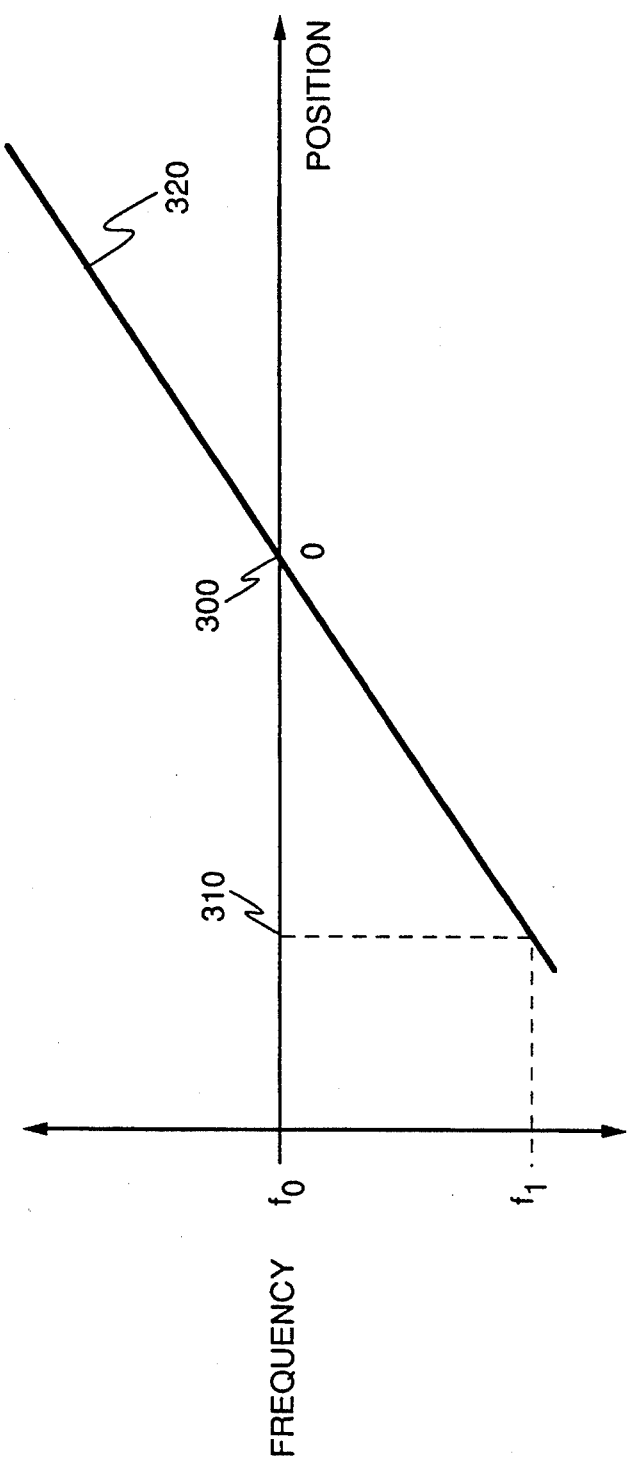
FIG. 3 is a graph of MR resonance frequency vs. position along a single axis in the presence of an applied magnetic field gradient.

Referring now to FIG. 3, the Larmor frequency of a spin is shown to be substantially proportional to its position when a magnetic field gradient is applied. A spin located at a center point 300 of the gradient coil (130 of FIG. 1) precesses at a Larmor frequency $f_0$. The Larmor frequency $f_0$ at point 300 of a specific type of nuclear spin is determined by the static magnetic field generated by magnet (125 of FIG. 1). A spin at a location 310 has a Larmor frequency $f_1$ determined by the sum of the static magnetic field and the additional magnetic field created at that location by magnetic field gradient coil (130 of FIG. 1). Since the gradient coil response 320 is substantially linear, the Larmor frequency of the spin is substantially proportional to position. This relationship between Larmor frequency and spin position is used to create an MR image.

Figure 4:
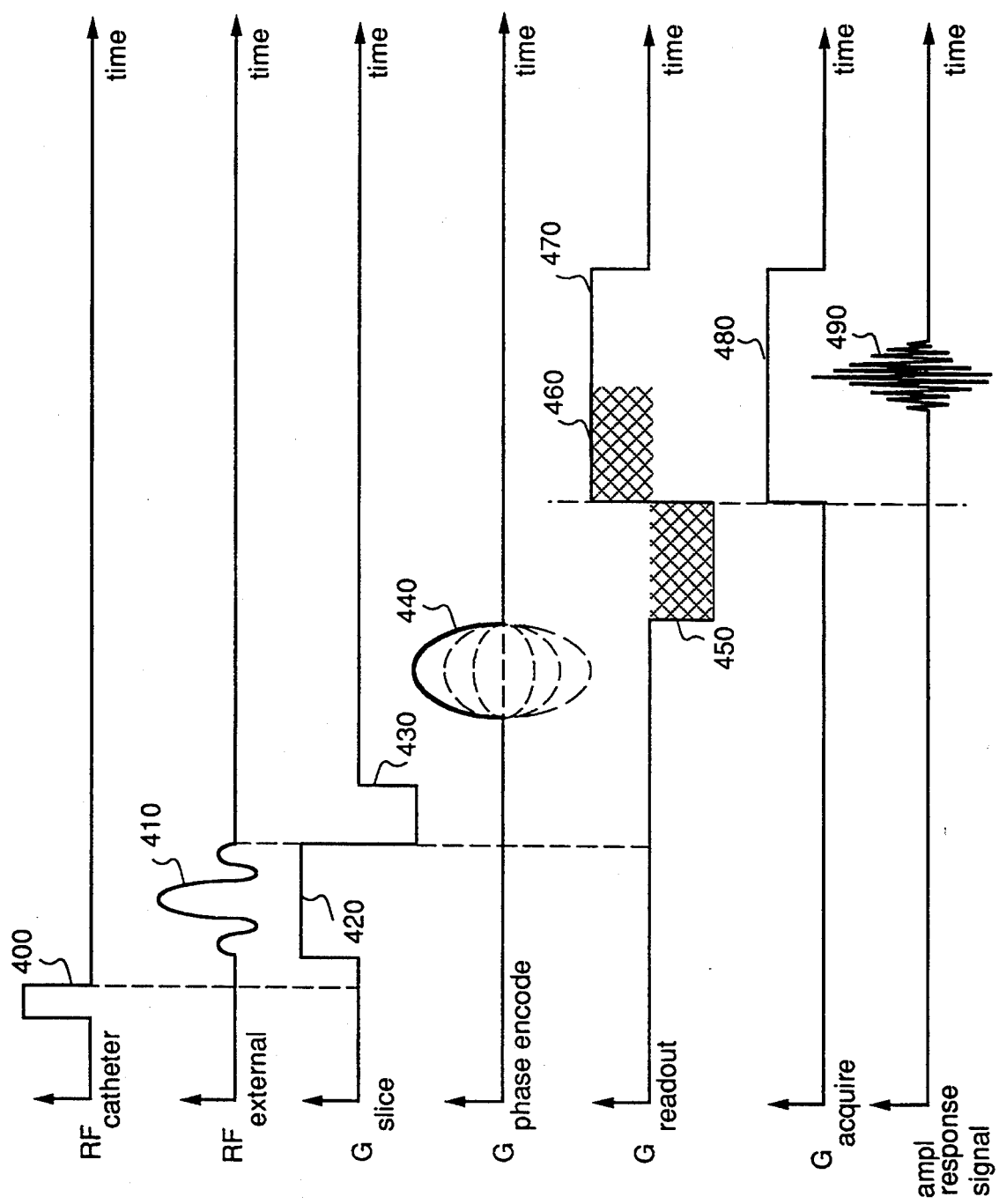
FIG. 4 is a timing diagram showing the relationships between RF pulses, magnetic field gradient pulses, data acquisition and detected signals in a first embodiment of the invention.

MR response signals generated in response to the RF and magnetic field gradient pulses are detected by external RF coil 140 or an alternate receive coil. A presently preferred MR pulse sequence and its pulse timing are illustrated in FIG. 4.

A first RF pulse 400 of a selected amplitude and duration is applied to small RF coil 200 and excites all spins of subject 100 within the sensitive volume of the RF coil in MR-active invasive device 150. RF pulse 400 alters the longitudinal spin magnetization of a small volume near the RF coil 200. RF pulse 400 can, for example, either invert spin magnetization or saturate spin magnetization. The volume in which spin magnetization is altered depends upon the RF power transmitted and the transmission pattern of RF coil 200.

Shortly after first RF pulse 400 a second RF pulse 410 is applied to external radio-frequency coil 140. Simultaneous with second RF pulse 410, a first magnetic field gradient pulse 420 is applied in a first selected direction. Gradient pulse 420 causes the spin magnetization within subject 100 to have a Larmor frequency which varies with position along the direction of magnetic field gradient created by gradient pulse 420. The bandwidth and frequency of second RF pulse 410 are selected so that only a selected slice within subject 100 is excited.

After first magnetic field gradient pulse 420 has been applied a second magnetic field gradient pulse 430 is applied in the same direction as the first, but with opposite polarity. The amplitude and duration of second gradient pulse are selected to cause transverse spin magnetization created by second RF pulse 410 to be in phase upon completion of second gradient pulse 430 in a manner well known to those skilled in the art. After completion of first magnetic field gradient pulse 420 a third magnetic field gradient pulse 440 of a selected amplitude is applied in a second direction substantially orthogonal to both the first selected direction. Also, after completion of first magnetic field gradient pulse 420, a fourth magnetic field gradient pulse 450 is applied in a third direction substantially orthogonal to the first and second selected directions. Fourth magnetic field gradient pulse 450 dephases spin magnetization in subject 100 to a degree proportional to the position of the spin in the third selected direction. Fourth gradient pulse 450 is followed by a fifth magnetic field gradient pulse 460 having an opposite polarity to form a bi-lobed magnetic field gradient pulse. The product of the magnetic field gradient magnitude and duration of the fourth and fifth gradient pulses (i.e., the areas of the cross-hatched regions) are chosen to be substantially identical. The amplitude of fifth magnetic field gradient pulse 460 is maintained effectively creating a sixth pulse 470 having an area substantially identical to that of fifth pulse 460. Note that fifth gradient pulse 460 and sixth gradient pulse 470 in fact form a single pulse. This single pulse has been divided in two pulses solely for purposes of identification. At the end of the fifth gradient pulse 460 all spins in subject 100 are substantially in phase. Sixth gradient pulse 470 causes additional dephasing of the MR signal.

During fifth gradient pulse 460 and sixth gradient pulse 470, a data acquire signal 480 causes a first MR response signal 490 to be received from RF coil 140. MR response signal 490 is digitized and stored in imaging unit 170 (FIG. 1). The MR response signal 490 from each portion of subject 100 has a maximum substantially at the end of fifth gradient pulse 460 and a Larmor frequency which is substantially proportional to the position of the MR signal source along the third selected direction. The phase of the MR response signal 490 from each portion of subject 100 is proportional to the duration and amplitude of third magnetic field gradient pulse 440 and the position of the MR signal source (population of spins) along the second selected direction.

First RF pulse 400, second RF pulse 410, first magnetic field gradient pulse 420, second magnetic field gradient pulse 430, third magnetic field gradient pulse 440, fourth magnetic field gradient pulse 450, fifth magnetic field gradient pulse 460 and sixth magnetic field gradient pulse 470 comprise an imaging subsequence. In the present invention, this sub-sequence is applied a plurality, Y, times, each time with a unique selected amplitude third magnetic field gradient pulse 440. Y MR response signals can be Fourier transformed in two orthogonal dimensions to form an MR image in which pixel signal intensity is directly proportional to the amount of nuclear spin magnetization in a given location in a manner well known to those skilled in the art.

In the first embodiment of the present invention, the imaging sub-sequence is applied a second plurality Y times with a different selected amplitude first RF pulse 400. MR response signals from the first Y applications of the imaging sub-sequence and the second Y applications of the imaging sub-sequence are subtracted from one another to highlight changes caused by the presence/absence of first RF pulse 400. All other features will be canceled by subtraction. Note that it is also possible to subtract the MR images obtained by Fourier transformation to achieve the same result.

In another embodiment, the first and second plurality Y applications of the imaging sub-sequence can be applied in an interleaved fashion to maximize the detection of MR signal changes arising from the presence/absence of first RF pulse 400. In yet another variation of the present invention, RF pulse 400 is given a very long duration and is applied continuously during part or all of the imaging sub-sequence. The imaging subsequence outlined in FIG. 4 will cause the collection of two dimensions of data. The present invention can be readily extended to three dimensions in a manner well known to those skilled in the art.

Figure 5:
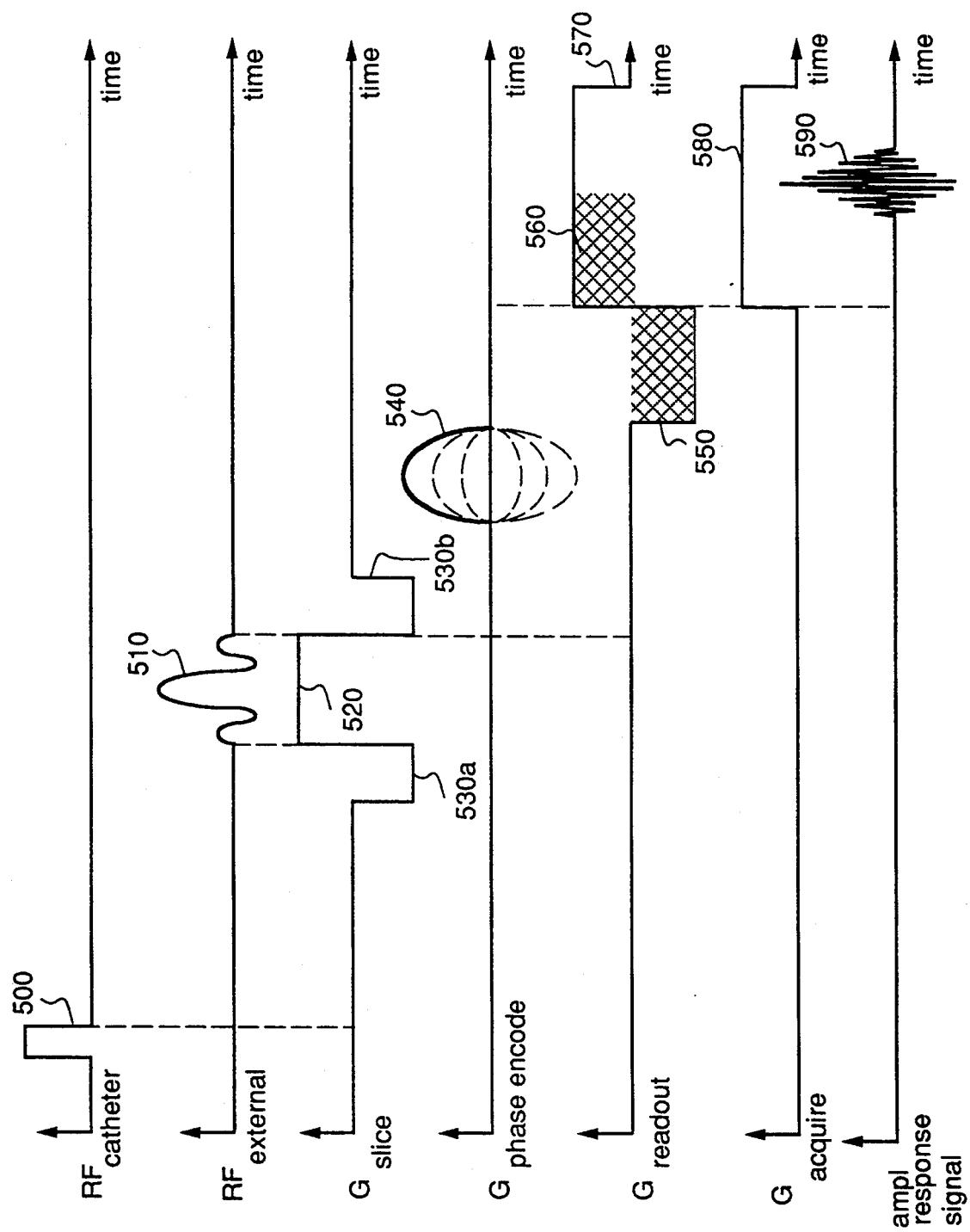
FIG. 5 is a timing diagram showing the relationships between RF pulses, magnetic field gradient pulses, data acquisition and detected signals in a second embodiment of the invention.

Another embodiment of the present invention is shown in FIG. 5. In this timing diagram, a first RF pulse 500 of a selected amplitude and duration is applied to small RF coil 200 and excites all spins of subject 100 within the sensitive volume of the RF coil in MR-active invasive device 150. In the second embodiment of the invention, RF pulse 500 alters the transverse spin magnetization within a small volume near RF coil 200 in MR-active invasive device 150. RF pulse 500 can nutate spin magnetization by a selected amount between zero and 180 degrees.

Shortly after first RF pulse 500, a first magnetic field gradient pulse 530a is applied in a first selected direction to dephase transverse spin magnetization. A second RF pulse 510 is applied to external RF coil 140. Second RF pulse refocuses spin magnetization in a fashion well known to those skilled in the art.

First magnetic field gradient pulse 530a is followed by a second magnetic field gradient pulse 520 of a selected amplitude which is applied simultaneously with second RF pulse 510. Second gradient pulse 520 causes the spin magnetization within subject 100 to have a Larmor frequency which varies with position along the direction of magnetic field gradient created by second gradient pulse 520. The bandwidth and frequency of second RF pulse 510 are selected so that only a selected slice within subject 100 is excited. If desired, the amplitude of second magnetic field gradient pulse 520 can be selected to be substantially zero, thereby causing spin refocusing within the entire active volume of external RF coil 140.

After second magnetic field gradient pulse 520 has been applied, a third magnetic field gradient pulse 530b is applied in the same direction as the first, but with opposite polarity. The amplitude and duration of third gradient pulse are selected to cause transverse spin magnetization to have the same phase upon completion of third gradient pulse 530b as it had prior to the application of first gradient pulse 530a in a manner well known to those skilled in the art.

After completion of second magnetic field gradient pulse 520 a fourth magnetic field gradient pulse 540 of a selected amplitude is applied in a second direction substantially orthogonal to the first selected direction. Also, after completion of second magnetic field gradient pulse 520, a fifth magnetic field gradient pulse 550 is applied in a third direction substantially orthogonal to the first and second selected directions. Fifth magnetic field gradient pulse 550 dephases spin magnetization in subject 100 to a degree proportional to the position of the spin in the third selected direction. Fifth gradient pulse 550 is followed by a sixth magnetic field gradient pulse 560 having an opposite polarity to form a bi-lobed magnetic field gradient pulse. The product of the magnetic field gradient magnitude and duration of the fifth and sixth gradient pulses (i.e., the areas of the crosshatched regions) are chosen to be substantially identical. The amplitude of sixth magnetic field gradient pulse 560 is maintained effectively creating a seventh pulse 570 having an area substantially identical to that of sixth pulse 560. Note that sixth gradient pulse 560 and seventh gradient pulse 570 in fact form a single pulse. This single pulse has been divided in two pulses solely for purposes of identification. At the end of the sixth gradient pulse 560 all spins in subject 100 are substantially in phase. Seventh gradient pulse 570 causes additional dephasing of the MR signal.

During sixth gradient pulse 560 and seventh gradient pulse 570, a data acquire signal 580 causes a first MR response signal 590 to be received from radio-frequency coil 140. MR response signal 590 is digitized and stored in imaging unit 170 (FIG. 1). MR response signal 590 from each portion of subject 100 has a maximum substantially at the end of sixth gradient pulse 560 and a Larmor frequency which is substantially proportional to the position of the MR signal source along the third selected direction. The phase of the MR response signal 590 from each portion of subject 100 is proportional to the duration and amplitude of fourth magnetic field gradient pulse 540 and the position of the MR signal source along the second selected direction.

First RF pulse 500, second RF pulse 510, first magnetic field gradient pulse 530a, second magnetic field gradient pulse 520, third magnetic field gradient pulse 530b, fourth magnetic field gradient pulse 540, fifth magnetic field gradient pulse 550, sixth magnetic field gradient pulse 560 and seventh magnetic field gradient pulse 570 comprise an imaging sub-sequence. In the present invention, this sub-sequence is applied a plurality, Y, times, each time with a unique selected amplitude fourth magnetic field gradient pulse 540. The Y MR response signals can be Fourier transformed in two orthogonal dimensions to form an MR image in which pixel signal intensity is directly proportional to the amount of nuclear spin magnetization in a given location in a manner well known to those skilled in the art.

In this embodiment of the present invention the imaging sub-sequence need not be applied a second plurality of Y times with a different selected amplitude first RF pulse 500 as in the embodiment of FIG. 4 since only spin magnetization which has received its initial nutation from small RF coil 200 in MR-active invasive device 150 will be imaged. Nevertheless, it may be useful to acquire a second set of Y MR response signals responsive to a second Y applications of the imaging sub-sequence in which the amplitude or phase of first RF pulse 500 is changed as in the embodiment of FIG. 4. First and second sets can then be subtracted from one another to highlight changes caused by the modulation of first RF pulse 500. All other features will be canceled by subtraction. Note that it is also possible to subtract the MR images obtained by Fourier transformation to achieve the same result.

In an alternative embodiment of the present invention, second RF pulse 510, first, second and third magnetic field gradient pulses 530a, 520, 530b are omitted such that first RF pulse 500 is immediately followed by fourth magnetic field gradient pulse 540 and fifth magnetic field gradient pulse 550. In this embodiment, the transverse magnetization generated by first RF pulse 500 is detected directly by external RF coil 140.

Figure 6:
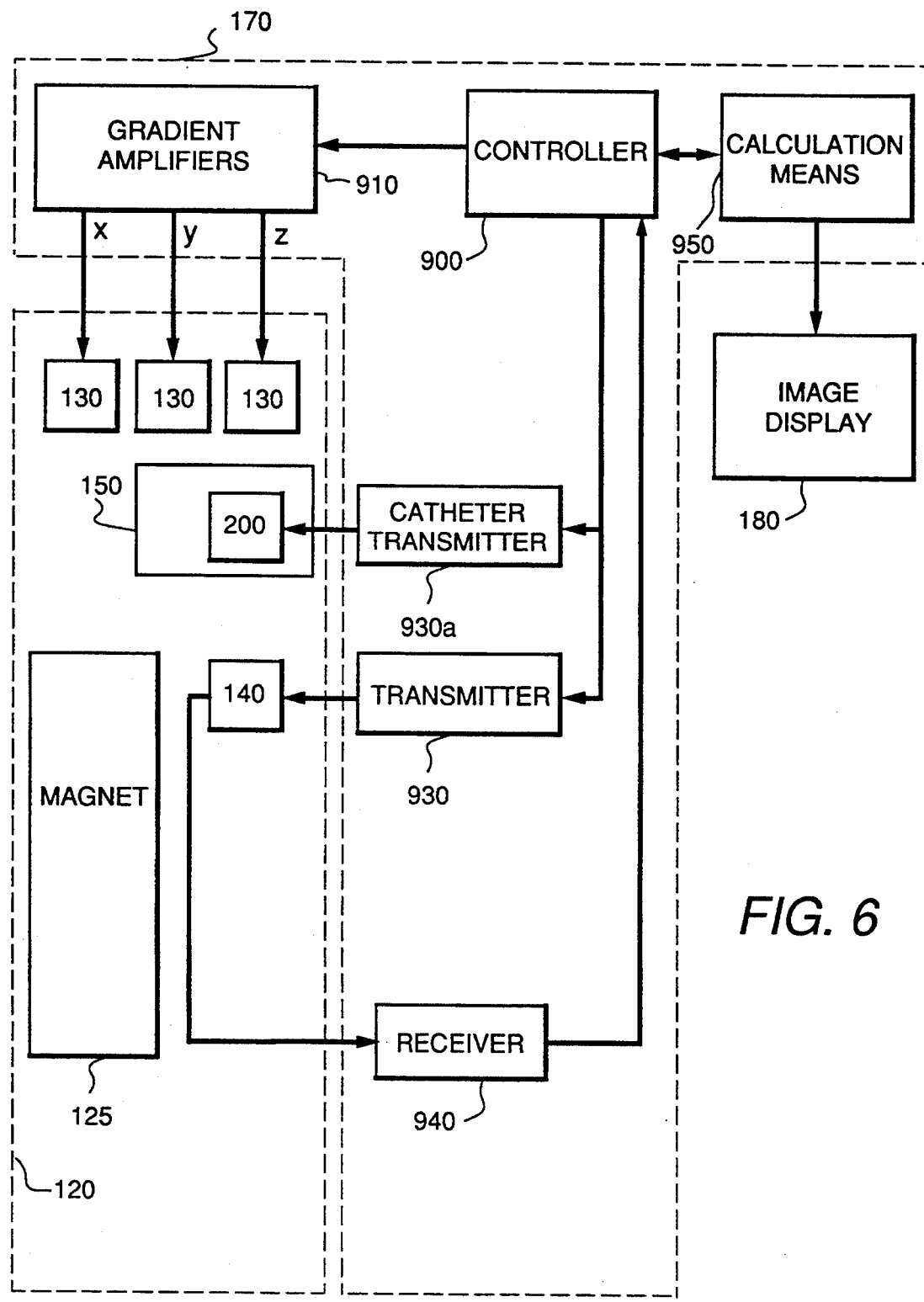
FIG. 6 is a block diagram of a vessel selective MR imaging system suitable for MR angiography according to the present invention.

In FIG. 6, a block diagram of an MR system suitable for vascular imaging and device tracking is illustrated. The system comprises a controller 900 which provides control signals to a set of magnetic field gradient amplifiers 910. These amplifiers drive magnetic field gradient coils 130 situated within the magnet enclosure 120. Gradient coils 130 are capable of generating magnetic field gradients in three mutually orthogonal directions.

Controller 900 also generates signals which are supplied to an invasive device transmitter 930a to generate RF pulses at one or more predetermined frequencies and with suitable power to nutate selected spins within the sensitive volume of small RF coil 200 situated within MR-active invasive device 150. Controller 900 also generates signals which are supplied to a transmitter 930 to generate RF pulses at one or more predetermined frequencies and with suitable power to nutate selected spins within external RF coil 140 situated within the bore of magnet 125.

MR response signals are sensed by external RF coil 140 connected to receiver 940. Receiver 940 processes the MR response signals by amplifying, demodulating, filtering and digitizing.

Controller 900 also collects the signals from receiver 940 and propagates them to a calculation means 950 where they are processed. Calculation means 950 applies a Fourier transformation to the signals received from controller 900 to create an MR image. This image contains pixel information only from the blood downstream of MR-active invasive device 150. The image calculated by calculation means 950 are displayed on an image display means 180.

The MR system outlined in FIG. 6 may also be used for the generation of conventional MR images in a manner well known to those skilled in the art. In such a use, a single transmitter drives an external RF coil within the magnet. This coil is typically large enough to encompass either the body, head or an extremity of the subject. Received MR response signals are detected with either the same external coil used by the transmitter or a surface coil independent of the coil driven by the transmitter.

While several presently preferred embodiments of the novel MR vascular imaging system have been described in detail herein, many modifications and variations will now become apparent to those skilled in the art. It is, therefore, to be understood that the appended claims are intended to cover all such modifications and variations as fall within the true spirit of the invention.

What is claimed is:

1. A magnetic resonance (MR) imaging system for obtaining vessel-selective MR angiographic images from a subject comprising:
   a) magnet means for applying a homogeneous magnetic field having substantially uniform amplitude over said subject;
   b) a first RF transmitter means located external to said subject for transmitting RF energy into said subject of a selected duration, amplitude and frequency to cause nutation of a first selected ensemble of spins within said subject;
   c) a gradient means for varying the amplitude of the magnetic field in at least one spatial dimension over time;
   d) an MR-active invasive device means intended to be inserted within said subject comprised of at least one RF coil attached to the invasive device, each RF coil respectively nutating nuclear spin magnetization in its vicinity;
   e) a second RF transmitter means attached to said at least one RF coil within the MR-active invasive device for transmitting RF energy into said subject of a selected duration, amplitude and frequency to cause nutation of a second selected ensemble of spins;
   f) an external RF receive coil for detecting a set of MR response signals from the first and second selected ensembles of nutated spins with said subject;
   g) a receiver means coupled to the external RF receive coil for receiving the detected MR response signals from the selected ensemble of spins;
   h) a calculation means for calculating an angiographic image from the detected MR response signals;
   i) a controller means connected to the first RF transmitter means, the receiver means, the calculation means and the gradient means, for activating the first and second RF transmitter means, the receiver means, the calculation means and the gradient means each according to a predetermined MR pulse sequence; and
   j) a display means connected to the calculation means for displaying the calculated angiographic image to an operator.

2. A method for obtaining a vessel-selective magnetic resonance (MR) angiographic image from a subject comprising the steps of:
   a) applying a homogeneous magnetic field having substantially uniform amplitude over said subject;
   b) inserting an MR-active invasive device having an RF coil, into a selected vessel of said subject;
   c) transmitting RF energy from the MR-active invasive device into said subject of a selected duration, amplitude and frequency to cause nutation of a first selected ensemble of spins;
   d) transmitting RF energy from an RF coil external to said subject into said subject to cause nutation of a second selected ensemble of spins;
   e) varying the amplitude of the magnetic field in at least one spatial dimension over time;
   f) detecting a plurality of MR response signals from the first and second selected selected ensembles of spins;
   g) processing the detected MR response signals;
   h) calculating an MR angiographic image of the selected vessel from the processed MR response signals; and
   i) displaying the MR angiographic image to an operator.

3. The method for obtaining a vessel-selective MR angiographic image from a subject of claim 2 wherein the step of calculating an MR angiographic image comprising the steps of:
   a) repeating steps 'c' through 'f' of claim 2 with a first predetermined value of RF energy transmitted from the MR-active invasive device to result in a first set of MR response signals;
   b) repeating steps 'c' through 'f' of claim 2 with a second predetermined value of RF energy transmitted from the MR-active invasive device to result in a second set of MR response signals; and
   c) subtracting the first set of MR response signals from the second set of MR response signals to result in the MR angiographic image.

4. The method for obtaining a vessel-selective MR angiographic image as recited in claim 2, wherein the stop of sensing the MR response signals occurs simultaneously with the stop of varying the amplitude of the magnetic field.

* * * * *